United States Patent [19]

Renner

[11] 4,371,605
[45] Feb. 1, 1983

[54] PHOTOPOLYMERIZABLE COMPOSITIONS CONTAINING N-HYDROXYAMIDE AND N-HYDROXYIMIDE SULFONATES

[75] Inventor: Carl A. Renner, Wilmington, Del.

[73] Assignee: E. I. Du Pont de Nemours and Company, Wilmington, Del.

[21] Appl. No.: 214,960

[22] Filed: Dec. 9, 1980

[51] Int. Cl.$^3$ .............................................. G03C 1/68
[52] U.S. Cl. ................................. 430/280; 430/914; 430/921; 204/159.14; 204/159.18
[58] Field of Search ...................... 430/280, 914, 921; 204/159.14, 159.18

[56] References Cited

U.S. PATENT DOCUMENTS

| | | | |
|---|---|---|---|
| 3,205,157 | 9/1965 | Licari et al. | 204/158 |
| 3,708,296 | 1/1973 | Schlesinger | 96/33 |
| 3,794,576 | 2/1974 | Watt | 204/159.11 |
| 3,816,279 | 6/1974 | Schlesinger | 204/159.11 |
| 4,012,366 | 3/1977 | Naarmann et al. | 260/79.7 |
| 4,066,636 | 1/1978 | Sera et al. | 260/117 |
| 4,069,054 | 1/1978 | Smith | 96/115 P |
| 4,069,055 | 1/1978 | Crivello | 96/115 R |
| 4,069,056 | 1/1978 | Crivello | 96/115 P |
| 4,111,926 | 9/1978 | Sera et al. | 260/117 |
| 4,150,988 | 4/1979 | Crivello | 96/35.1 |
| 4,258,121 | 3/1981 | Kojima | 430/281 |

FOREIGN PATENT DOCUMENTS 2045264  10/1980  United Kingdom .

OTHER PUBLICATIONS

Crivello, J. V., *Chemtech*, Oct. 1980, 624–628.
Cadogan, J. I. G. and Rowley, A. G., *J. Chem. Soc. Perkin I*, 1975, 1069–1071.
Fahmy, A. F. M., et al., *Bull. Chem. Soc. Jap.*, 50(10), 1977, 2678–2681.
Fahmy, A. F. M., et al., *Bull. Chem. Soc. Jap.*, 51(7), 1978, 2148–2152.

*Primary Examiner*—Jack P. Brammer

[57] ABSTRACT

A photopolymerizable composition and a photoimaging element. The photopolymerizable composition is a cationically polymerizable organic composition and a photoinitiator which is a N-hydroxyamide, or N-hydroxyimide, sulfonate.

26 Claims, No Drawings

PHOTOPOLYMERIZABLE COMPOSITIONS CONTAINING N-HYDROXYAMIDE AND N-HYDROXYIMIDE SULFONATES

TECHNICAL FIELD

This invention pertains to photopolymerizable compositions containing sulfonic acid esters of N-hydroxyamides and N-hydroxyimides as photoinitiators.

BACKGROUND INFORMATION

The use of Lewis acids to catalyze cationic polymerization of various organic compositions is generally known. Incorporation of compounds, which release a Lewis acid upon photolytic degradation, into photopolymerizable compositions has also been described in the literature. U.S. Pat. Nos. 3,708,296, 3,794,576, 3,816,279, and 3,205,157 disclose the use of aromatic diazonium salts; U.S. Pat. Nos. 4,150,988, 4,069,055, and 4,069,056 disclose the use of Group VA onium salts; U.S. Pat. No. 4,069,054 discloses the use of sulfonium salts as photoinitiators; and Crivello, in Chemtech, Oct., 1980, pp. 624–628, discloses the use of diaryliodonium salts. Disadvantages of certain known photopolymerizable compositions employing various "onium", diazonium and sulfonium salts are their thermal instability and instability in a dark environment.

Certain sulfonic acid esters of N-hydroxyamides and -imides are known. U.S. Pat. Nos. 4,111,926 and 4,066,636 disclose the use of N-aryl- and N-alkylsulfonyloxyimides and N-aryl- and N-alkylsulfonyloxybenztriazoles as hardening agents for gelatin. U.S. Pat. No. 4,012,366 discloses polymers which contain hydroxamic acid-O-sulfonyl groups in the side chains; these polymers are useful for the manufacture of moldings, coatings and adhesives. Fahmy, et al., in Bull. Chem. Soc. Jpn., 50, 2678–2681 (1977) and 51, 2148–2152 (1978), describe selected chemical reactions of N-(arylsulfonyloxy)phthalimides and the numerous reaction products obtained. Cadogan, et al., J. Chem. Soc. Perkin I, 1069–1071 (1975), describe the photolysis of N-tosyloxyphthalimide in the presence of aromatic compounds to give N-arylphthalimides, and p-toluenesulfonic acid as a by-product.

An object of this invention is to provide a photopolymerizable composition which is easy and inexpensive to prepare, highly stable under storage conditions, and heat resistant.

DISCLOSURE OF INVENTION

For further comprehension of the invention, and of the objects and advantages thereof, reference may be made to the following description and to the appended claims in which the various novel features of the invention are more particularly set forth.

The invention resides in photopolymerizable compositions consisting essentially of a mixture of at least one substance capable of cationic polymerization, herein referred to as a cationically polymerizable organic composition or as a polymerizable substance, and a photoinitiator which is a photosensitive sulfonic acid ester of a N-hydroxyamide or a N-hydroxyimide.

By "consisting essentially of" is meant that the photopolymerizable compositions must include the two essential ingredients, i.e., the polymerizable substance and the photoinitiator. Use of the term is not intended to preclude the presence of nonessential ingredients, such as photosensitizing compounds, binders, fillers, reinforcing agents, coloring agents, plasticizers and other inert additives commonly used in this art, provided the nonessential ingredients do not substantially adversely affect the invention.

The invention also resides in a photoimaging element comprising a substrate coated with a layer of the aforesaid photopolymerizable composition and to the use of the photoimaging element in a photocatalytic process.

By "comprising" is meant that the photoimaging element can include one or more substrates, one or more coatings of photopolymerizable compositions, as well as other materials, such as antihalation materials.

The photoinitiator of the invention, upon irradiation, is believed to undergo cleavage with production of the corresponding sulfonic acid. It is further believed that the acid produced catalyzes the cationic polymerization of the polymerizable substance. An advantage of the photopolymerizable compositions of this invention, compared with the "onium" cationic polymerization systems of the art, is their greatly improved dark and thermal stability. Thus, stabilizers are not necessary to prevent premature dark reaction of the photoinitiator. The good thermal stability of the photoinitiator allows heat treatment of the composition, after irradiation but before development, thus providing a significant increase in effective photospeed.

Substances that undergo photopolymerization in the presence of an acid catalyst are well-known. Some of these are included in the above-cited references which disclose photopolymerizable compositions. Polymerizable substances include compositions containing ethylenic unsaturation, compositions that polymerize by ring opening of cyclic groups, miscellaneous types such as melamine resins, and mixtures of any of the above. Examples of ethylenically unsaturated compounds capable of cationic polymerization include vinyl ketones, e.g., methyl vinyl ketone; alkenes and arylalkenes, e.g., 1-butene, 1-dodecene, styrene, and methyl-substituted styrenes; and vinyl ethers, e.g., vinyl methyl ether, vinyl 2-ethylhexyl ether, vinyl decyl ether and vinyl allyl ether.

Cyclic polymerizable substances include lactones and epoxides. A preferred class of cyclic polymerizable substances is monomeric and prepolymeric epoxides. Suitable epoxides include the epoxy resins obtained by the well-known reaction of epichlorohydrin and bisphenol-A in either monomeric or prepolymeric forms. Other epoxide materials available in polymerizable monomeric or prepolymeric forms include 1,2-epoxycyclohexane, vinylcyclohexene diepoxide, dicyclopentadiene diepoxide, ethylene oxide and its homologues such as propylene oxide and 2,3-epoxybutane. Other suitable cyclic ethers include oxetane and derivatives thereof such as 3,3-bis(chloromethyl)oxetane, tetrahydrofuran, and 1,3,5-trioxane. Glycidyl esters of acrylic acid and of its homologues methacrylic acid and crotonic acid, allyl glycidyl ether, glycidyl phenyl ether, copolymers of allyl glycidyl ether and glycidyl methacrylate, glycidyl alkyl ethers, epoxidized novalak prepolymers, and polyolefin epoxides are also useful. Esters of epoxidized cyclic alcohols, or of epoxidized cycloalkanecarboxylic acids, or of both, are useful epoxide or polyepoxide materials.

The photoinitiator of the invention is any photosensitive sulfonic acid ester of an N-hydroxyamide or -imide. Preferred are compounds which have the generic structures, respectively,

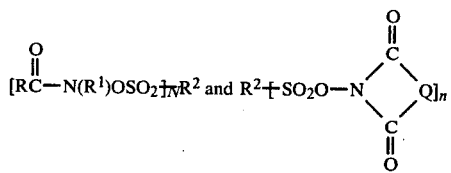  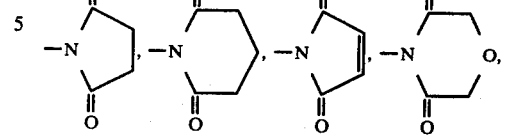

wherein $R^2$ is a n-valent organic group, including aliphatic, cycloaliphatic, and aromatic groups; R is an organic group, including aliphatic, cycloaliphatic, and aromatic groups; $R^1$ is H, an aliphatic or cycloaliphatic organic group and

Q, when combined with

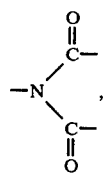

forms a 5–7 membered ring which can contain one or more additional hetero atoms such as nitrogen or oxygen, but which ring preferably includes only one nitrogen atom and no other hetero atoms; n is 1 or 2, preferably 1.

In the above formulae, $R^2$ is preferably a $C_1$–$C_{10}$ hydrocarbyl group or a substituted $C_1$–$C_{10}$ hydrocarbyl group with substituents selected from F, Cl, Br, $NO_2$, CN, $—\oplus N(CH_3)_3$, $C_6H_5$, $C_6F_5$, and $OCH_3$. Particularly preferred $R^2$ groups are $—CF_2CF_2H$ and perfluoroalkyl, because in these compounds photospeed is significantly higher and solubility of the photoinitiator is improved. Especially preferred is trifluoromethyl.

R is preferably an aryl group, e.g., phenyl, naphthyl, anthryl, or a substituted aryl of 6–14 carbon atoms. Preferred substituents include $C_1$–$C_4$ alkyl groups, Cl, Br, F, $OCH_3$, $OC_2H_5$, CN, $NO_2$, $—\oplus N(CH_3)_3$, $C_6H_5CO—$, $OCH_2C_6H_5$, $OCF_3$, and $C_6H_5$.

$R^1$ is preferably H, alkyl of 1–4 carbon atoms, or

Examples of suitable 5–7 membered rings comprising

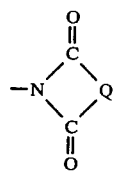

include the following groups:

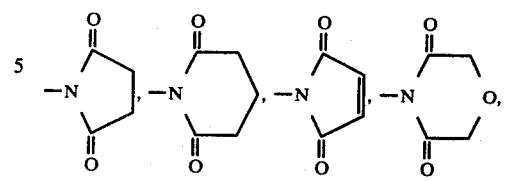

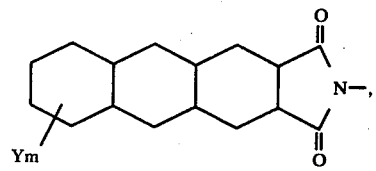

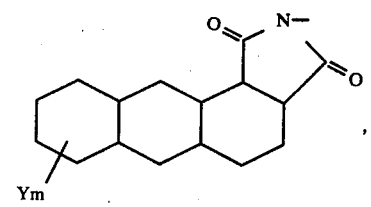

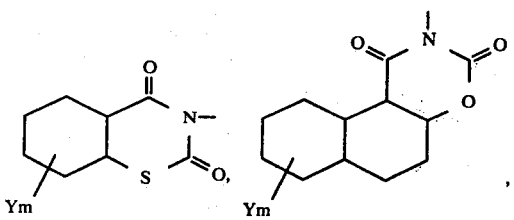

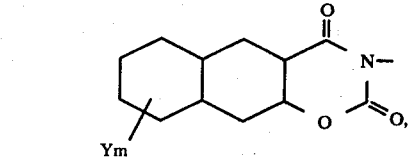

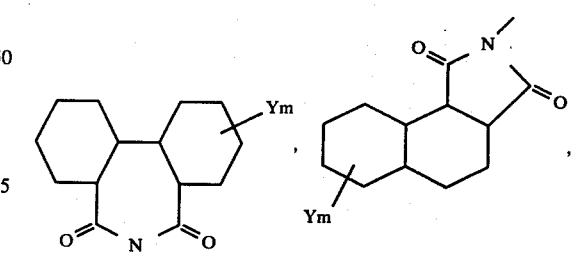

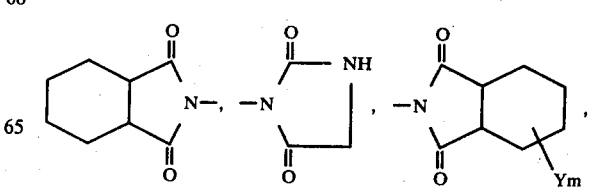

-continued

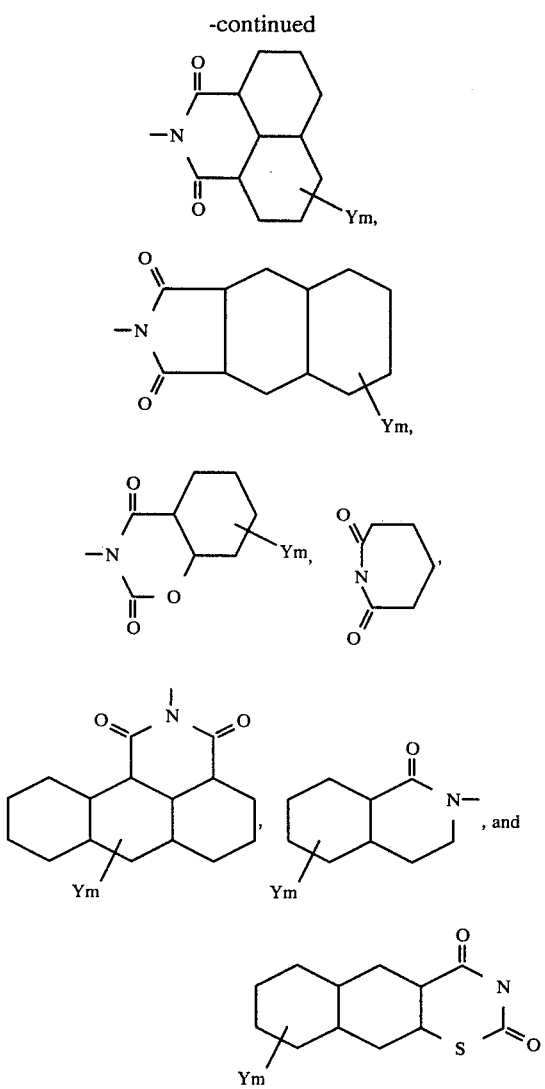

wherein m is an integer from 0–4 and Y is $C_1$–$C_4$ alkyl, Cl, $NO_2$, Br, F, $OCH_3$, $OC_2H_5$, OH, CN, $C_6H_5$, $OCH_2C_6H_5$, $CF_3$, and $—^{\oplus}N(CH_3)_3$.

The amount of photoinitiator employed is generally about 0.1 to about 10 percent by weight, preferably about 0.2 to about 5 percent by weight, based on the weight of the polymerizable substance. The photoinitiator is mixed with the polymerizable substance in an organic solvent which is a solvent for the ingredients of the composition. Examples of suitable solvents are given below.

If desired, nonessential additives can be mixed with the photopolymerizable composition, for example, photosensitizers, polymeric binders, coloring agents, dyes, dispersing agents, inorganic fillers or reinforcing agents, and plasticizers. A photosensitizing compound may be added to increase the speed of the photopolymerizable composition and/or to shift the radiation absorption of the composition toward the longer, i.e., visible, wavelength region of the spectrum. Preferred sensitizers include aromatic hydrocarbons and substituted aromatic hydrocarbons, e.g., as described in Example 5 below. The amount of sensitizer employed is generally about 1 to 20 percent by weight, preferably about 3 to 8 percent by weight, based on the total combined weight of the photoinitiator, the polymerizable substance and the nonessential additives.

When low molecular weight prepolymers or ethylenically unsaturated compounds are employed as the polymerizable substance, it is preferred that the photopolymerizable composition contain a polymeric binder which can serve to strengthen the composition or adhere it to a substrate. Radiation-transparent and film-forming polymer binders are preferred. Examples of suitable organic polymeric binders include thermoplastic macromolecular organic polymers which have number average molecular weights of at least about 1500, preferably at least about 4000, including such polymer types as: (a) copolyesters based on terephthalic, isophthalic, sebacic, adipic and hexahydroterephthalic acids; (b) polyamides; (c) vinylidene chloride copolymers; (d) ethylene/vinyl acetate copolymers; (e) cellulose ethers; (f) synthetic rubbers; (g) cellulose esters; (h) polyvinyl esters including polyvinyl acetate/acrylate and polyvinyl acetate/methacrylate copolymers; (i) polyacrylate and poly-α-alkylacrylate esters including polymethyl methacrylate, polyethyl methacrylate, and methyl methacrylate/ethyl acrylate copolymers; (j) high molecular weight polyethylene oxides of polyglycols having number average molecular weights of about 4000 to 1,000,000; (k) polyvinyl chloride and copolymers; (l) polyvinyl acetal; (m) polyurethanes; (n) polycarbonates; (o) polystyrenes.

When a polymeric binder is employed, it is present in an amount of about 10 to 85 percent, preferably about 25 to 75 percent, by weight, based on the total combined weight of the photoinitiator, the polymerizable substance and the nonessential additives.

If so desired, the photopolymerizable composition may also contain miscible polymeric or nonpolymeric inorganic binders, such as fillers or reinforcing agents which are substantially transparent at the wavelengths used for the exposure, e.g., the organophilic silicas, bentonites, silica, powdered glass, colloidal carbon, as well as various types of pigments. Such materials are used in amounts varying with the desired properties of the photopolymerizable composition. The fillers or reinforcing agents are useful in improving the strength of the compositions, reducing tack and in addition, as coloring agents. Other soluble nonessential additives which may also be employed include dyes and dispersing agents. A number of such ingredients are disclosed in U.S. Pat. Nos. 2,760,863, 3,060,026, and 3,203,805. These additives are generally present in minor amounts so as not to interfere with the exposure of the photopolymerizable composition.

With certain polymers, it may be desirable to add a plasticizer to give flexibility to the photopolymerizable composition and to facilitate selective development. The plasticizer can be any of the common plasticizers compatible with the binder. Suitable plasticizers include the polyethylene glycols, such as the commercially available Carbowax ® materials and related materials such as substituted phenol/ethylene oxide adducts, e.g., the polyethers obtained from o-, m-, and p-cresol, o-, m-, and p-phenylphenol and p-nonylphenol, and ethylene oxide; including commercially available materials such as the alkyl phenoxypolyoxyethylene ethanols. Other suitable plasticizers include the acetates, propionates, butyrates and other carboxylate esters of ethylene glycol, diethylene glycol, glycerol, pentaerythritol, and other polyhydric alcohols, and alkyl and aryl phosphates such as tributyl phosphate, trihexyl phosphate, trioctyl phosphate, triphenyl phosphate, tricresyl phosphate and cresyl diphenyl phosphate.

The photopolymerizable composition can be applied to a wide variety of substrates to produce a layered element. By "substrate" is meant any natural or synthetic support which is capable of existing in a flexible or rigid film or sheet form. For example, the substrate can be a metal sheet or foil, a sheet or film of synthetic organic resin, cellulose paper, fiberboard, and the like, or a composite of two or more of these materials.

The particular substrate will generally be determined by the use being made of the element. For example, when printed circuits are produced, the substrate may be a plate which is a copper coating on fiberboard; in the preparation of lithographic printing plates, the substrate may be anodized aluminum. Additional examples of specific substrates include alumina-blasted aluminum, alumina-blasted polyethylene terephthalate film, polyethylene terephthalate film, resin-subbed polyethylene terephthalate film, polyvinyl alcohol-coated paper, cross-linked polyester-coated paper, nylon, glass, cellulose acetate film, and heavy paper such as lithographic paper.

An antihalation material can be included in the element by layering it between the photopolymerizable composition and the substrate. It may also be incorporated in the substrate. When an antihalation layer is used between the photopolymerizable composition and the substrate, the antihalation material must have adequate adhesion to the substrate and the photopolymerizable composition and not react with the radiation-adsorptive material. Antihalation materials are disclosed in United Kingdom Spec. No. 1,366,769.

The photopolymerizable composition is usually applied to the substrate as a solution or dispersion in a carrier solvent. The solution or dispersion can be sprayed, brushed, applied by a roller or an immersion coater, flowed over the surface, picked up by immersion or applied to the substrate by other suitable means. The solvent is then evaporated. The solvents which are usually employed are volatile at atmospheric pressure. Examples of suitable solvents include amides such as N,N-dimethylformamide and N,N-dimethylacetamide; alcohols and ether alcohols such as methanol, ethanol, 1-propanol, 2-propanol, butanol, ethylene glycol, 2-butoxyethanol, and 2-ethoxyethanol; esters such as methyl acetate and ethyl acetate; aromatic hydrocarbons and aromatic halohydrocarbons such as benzene, o-dichlorobenzene and toluene; ketones such as acetone, 2-butanone, and 3-pentanone; aliphatic halohydrocarbons such as 1,1,1-trichloroethane, methylene chloride, chloroform, 1,1,2-trichloroethane, 1,1,2,2-tetrachloroethane, and 1,1,2-trichloroethylene; miscellaneous solvents such as acetonitrile, dimethyl sulfoxide, pyridine, tetrahydrofuran, 1,2-dimethoxyethane, dioxane, dicyanocyclobutane, N-methylpyrrolidone; and mixtures of these solvents in various proportions as may be required to achieve solutions of the photopolymerizable compositions.

Alternatively, the photopolymerizable composition can be formed into a film and the film can be applied to the substrate.

Preferably, the layers of the photopolymerizable compositions have a thickness ranging from about 0.0001 inch (~2.5 μm) to 0.01 inch (~250 μm) and are applied to a thin, flexible, polymeric film support which can transmit actinic radiation to the photopolymerizable layer. The opposite side of the photopolymerizable layer can have adhered thereto a protective cover layer or cover sheet wherein the sheet has less adhesion to the layer than to the film support.

The photopolymerizable composition of this invention can be exposed imagewise to actinic radiation, a portion of which preferably contains wavelengths between about 2500–5000 Å. Suitable sources of such radiation include ordinary sunlight and artificial sources such as sunlamps, pulsed and continuous xenon flash lamps, tungsten-halogen lamps, germicidal lamps, ultraviolet lamps providing radiation of short wavelength (2537 Å), and lamps providing radiation of longer wavelengths, narrow or broad band, centered near 3600 Å, 4200 Å, 4500 Å, or 5000 Å, such as fluorescent, mercury, metal additive, and arc lamps. Argon glow lamps, photographic flood lamps, and other fluorescent radiation sources such as the tracings on the face of a cathode ray tube can also be used. Electron accelerators, electron beam sources through an appropriate mask, and laser sources are also suitable. The mercury-vapor lamps, particularly the sunlamp or "black light" type, the fluorescent sunlamps, the xenon flash lamps, and the tungsten-halogen lamps are the most preferred.

The radiation exposure times may vary from fractions of a second to several minutes, depending upon the intensity and spectral energy distribution of the radiation used, its distance from the photopolymerizable layer, and the amount of the polymerizable substance. Customarily, a distance of about 4–150 cm from the photopolymerizable layer is used. Exposure temperatures are not particularly critical, but it is preferable to operate at about ambient temperatures or slightly higher, i.e., about 20° to about 50° C.

Imagewise exposure is conveniently carried out by exposing the photopolymerizable element to actinic radiation through a process transparency. The process transparency may be an image-bearing transparency. It may consist solely of areas substantially opaque to, and areas substantially transparent to, the radiation being used, where the opaque areas are of substantially the same optical density, e.g., a so-called line or halftone negative or positive. Or, the process transparency may have a graded range of opaque areas, for example, a continuous tone negative. Process transparencies may be constructed of any suitable materials including cellulose acetate film and polyester film.

Polymerization of the cationically polymerizable organic composition can be continued subsequent to radiation exposure of the composition by a suitable heat treatment. Thus, greatly increased photospeeds are obtained without an increase in radiation exposure; this alternative process is illustrated in Example 10 below. It is preferable to carry out this post-exposure heating process at temperatures of about 70° to 140° C. for a time of a few seconds or more, generally up to 20 minutes.

Following exposure and any subsequent heat treatment, the image is developed. Development can be effected by toning, i.e., dusting with a fine pigment which selectively adheres to the tacky unhardened areas, or by dye absorption imaging. Generally, however, the portions of the layer corresponding to the unexposed portions are removed, e.g., in lithographic applications. This method of development can be achieved by pressure transfer, differential adhesion of the exposed and unexposed areas or, preferably, by solvent washout. The solvent liquid used for development should have good solvent action on the nonpolymerized portions of the layer and little action on the insolubilized image in the time required to remove the soluble portions.

In the following examples illustrative of the invention, all parts and percentages are by weight and all degrees in Celsius unless otherwise stated. The epoxy resin employed in the Examples, ECN-1299, is an epoxy novolak resin of molecular weight 1270 and epoxy equivalent weight of 235. It is available from Ciba-Geigy Co.

EXAMPLE 1

N-Tosyloxytetrachlorophthalimide was prepared by the following procedure. To a flask equipped with a stirrer and addition funnel were added N-hydroxytetrachlorophthalimide (10.00 g, 0.033 mol), p-toluenesulfonyl chlorde (6.57 g, 0.033 mol) and 100 mL of dried tetrahydrofuran (THF). A solution of triethylamine (4.5 mL, 0.033 mol) in 20 mL of THF was added dropwise while the reaction vessel was cooled to between $-20°$ and $-10°$. A red color formed after each drop, and quickly disappeared. After stirring for 2 h at room temperature the reaction mixture was diluted with 200 mL of methylene chloride, and the solution was washed twice with water. The organic layer containing much crystallized product was evaporated, leaving 13.5 g of pale yellow N-tosyloxytetrachlorophthalimide: mp 206°–210°. Recrystallization from toluene (50 mL)-heptane (25 mL) gave 10.7 g (71.5%) of pale yellow product: mp 214°–216°; ir (KBr) 1800 (w), 1740 (vs), 1380 (m), 1190 (m), 1180 (m), 1140 (m), 1025 (m), 810 (m), 790 (m), 725 (m), 705 (m), 506 (m); uv (CH$_3$CN) 240 (58,500), 275 (2990), 328 (2790), 339 nm (3020); mass spectrum 452.8782 (calcd for $C_{15}H_7NO_5Cl_4S$: m+, 452.8805). Anal. Calcd for $C_{15}H_7NO_5Cl_4S$: C, 39.59; H, 1.55; N, 3.08; O, 17.58; Cl, 31.16; S, 70.4. Found: C, 40.04, 40.16, 39.70, 39.72; H, 1.95, 1.81, 1.52, 1.70; N, 2.99, 2.89; Cl, 31.30.

A solution was prepared by adding 15 mg of N-tosyloxytetrachlorophthalimide from above to 3.0 mL of 10 percent ECN-1299 epoxy resin in 1:1, by volume, acetonitrile-1,2-dimethoxyethane (DME). Portions of this solution were coated onto plates of anodized aluminum. Irradiation of the coated plates with a 275 W sunlamp at 17 cm for 5 min gave a coating of polymer which could not be removed by washing with acetone or methanol. Heating unphotolyzed samples with a heat gun did not lead to any insoluble polymer.

Irradiation of a coated plate through a $\sqrt[3]{2}$ step wedge process transparency for 30 min, followed by washing with acetone gave a clear image of 8 steps, two of which were partial steps. The observed resolution from a portion under an Itek resolution target was 16 line pairs/mm.

EXAMPLE 2

N-Methanesulfonyloxytetrachlorophthalimide was prepared by the following procedure. To a flask equipped with a stirrer and addition funnel were added N-hydroxytetrachlorophthalimide (9.00 g, 0.030 mol), methanesulfonyl chloride (3.60 g, 0.032 mol), and 200 mL of methylene chloride. The mixture was cooled in ice and a solution of triethylamine (5.0 mL, 0.036 mol) in 25 mL of methylene chloride was added slowly. Upon completion of this addition the reaction mixture was diluted with 200 mL of methylene chloride and washed successively with water (250 mL), 5% aqueous sodium bicarbonate (250 mL), and water (250 mL). The organic layer which contained a substantial amount of precipitated product was evaporated, and the resulting solid was dried by addition of toluene and evaporation to give 9.89 g (87.0%) of pale yellow crystalline N-methanesulfonyloxytetrachlorophthalimide: mp 240°–241°; uv (CH$_3$CN) 240 (51,400), 329 (2736), 340 nm (2937); ir (KBr) 3040 (w), 3020 (w), 2940 (w), 1800 (m), 1700 (vs), 1375 (s), 1330 (m), 1310 (m), 1180 (s), 1120 (m), 1030 (s), 965 (m), 790 (m), 725 (s); nmr (CDCl$_3$) 3.53 (s); mass spectrum 376.8472 (calcd for $C_9H_3NO_5Cl_4S$: 376.8783). Anal. Calcd for $C_9H_3NO_5Cl_4S$: C, 28.52; H, 0.80; N, 3.70; O, 21.11; Cl, 37.42; S, 8.46. Found: C, 28.52, 28.94, 28.92; H, 0.80, 1.07, 1.05; N, 3.70, 3.84, 3.82; Cl, 37.42, 37.08.

To approximately 1.5 mL of a 10% solution of ECN-1299 epoxy resin in 1:1, by volume, acetonitrile-DME was added 6 mg of N-methanesulfonyloxytetrachlorophthalimide from above. The solution was coated onto an anodized aluminum plate. After drying, the plate was exposed through a $\sqrt[3]{2}$ step wedge process transparency to a 275 W sunlamp at 17 cm distance for 30 min. The exposed plate was washed with acetone; insoluble polymer remained in the light-exposed areas and no polymer remained in the light-shielded areas.

EXAMPLE 3

N-Hydroxy-N-methylbenzamide starting material was prepared in two steps by the following procedure.

To a flask equipped with a stirrer and an addition funnel were added 150 mL of pyridine and N-methylhydroxylamine hydrochloride (10.0 g, 0.119 mol). After a clear solution was obtained, benzoyl chloride (33.9 g, 0.242 mol) was added dropwise. After stirring for 3 h the reaction mixture was poured into 300 mL of ice/130 mL concentrated hydrochloric acid. The mixture was extracted 3 times with methylene chloride, the organic layer was dried, and the solvent was evaporated to leave 29.2 g (100%) of pale yellow liquid N-methyl-N-benzoyloxybenzamide which crystallized after one week: mp 40°–48°; nmr 8.0–7.2 (m, 10H), 2.50 (s, 3H); ir (neat) 3060, 2930, 1750, 1655.

To a flask equipped with a stirrer and a heating mantle were added N-methyl-N-benzoyloxybenzamide (29.2 g, 0.119 mol) from above, 100 mL of water, and 10 g of sodium hydroxide. The mixture was stirred well and heated to 70°. A clear solution was obtained in 30 min. After a total of 45 min the solution was cooled and concentrated hydrochloric acid was added to bring the solution to pH 7. The mixture was extracted with methylene chloride, and the organic layer was dried, first with magnesium sulfate and then with 4 Å molecular sieves. Evaporation of the solvent gave 14.7 g (81%) of colorless, liquid, N-hydroxy-N-methylbenzamide; nmr (CDCl$_3$) 9.67 (broad s, CH, 1H), 7.7–7.1 (m, 5H), 3.20 (s, 3H). Attempts to vacuum distill the product were unsuccessful because of thermal decomposition.

N-Tosyloxy-N-methylbenzamide was prepared by the following procedure. To a flask equipped with a stirrer were added N-hydroxy-N-methylbenzamide (1.39 g, 0.010 mol) from above, p-toluenesulfonyl chloride (1.91 g, 0.010 mol), 25 mL of THF and 2 mL of triethylamine. After 30 min at 0° followed by 1 h at room temperature, the reaction mixture was diluted with 50 mL of methylene chloride, and the solution was washed with water (4×50 mL) and dried. Evaporation of the solvent left 2.84 g of a golden oil which soon crystallized. Recrystallization from methylene chloride-hexane gave 2.04 g (69.4%) of fluffy white N-tosyloxy- N-methylbenzamide: mp 98°–99.5°; nmr (CDCl₃) 7.8–7.0 (A₂B₂ and singlet at 7.36, 9H), 3.53 (s, 3H), 2.38 (s, 3H); ir (KBr) 1684 (vs), 1370 (s), 1180 (s), 1170 (s), 880 (m), 805 (m), 735 (m), 695 (s), 651 (m), 540 (s): uv (CH₃CN) 227 (19,200), 265 (sh, 2020), 273 nm (sh, 1500); mass spectrum 305.0720 (calcd for C₁₅H₁₅O₄NS: m+, 305.0720). Anal. Calcd for C₁₅H₁₅O₄NS: C, 59.00; H, 4.95; N, 4.59; S, 20.96; O, 10.50. Found: C, 58.87, 58.75; H, 4.98, 5.02; N, 4.52, 4.43.

A solution was prepared of N-tosyloxy-N-methylbenzamide (4–5 mg) from above and approximately 0.5 mL of a 10 percent solution of ECN-1299 epoxy resin in 1:1, by volume, acetonitrile-DME. An anodized aluminum plate was coated with the solution. After drying, the plate was exposed to a 275 W sunlamp for 10 min at a distance of 10 in (25.4 cm). The plate was washed with acetone to leave insoluble polymer in the light-exposed areas and no polymer in the shielded areas.

EXAMPLE 4

N-Tosyloxyphthalimide was prepared by a procedure analogous to that described in Example 1.

A solution was prepared by mixing 3.44 g of a methylated/butylated (1/1) melamine resin, mw=516, (Resimene ® 755, Monsanto Co.) and 20.0 g of an 81.1% solution of a styrene/methyl methacrylate/hydroxyethyl acrylate/n-butyl acrylate (15/15/32/38) copolymer, mw=3000, in 2-butanone. To 1 ml of this solution was added 20 mg of N-tosyloxyphthalimide from above dissolved in a minimum of acetone. A portion of the resulting solution was coated onto an aluminum plate. Irradiation of the coated plate with a 275 W sunlamp at a distance of about 12 in (30.5 cm) and a plate temperature of about 60° produced in 15 min a clear hard finish which could not be washed off with acetone. In the areas unexposed to light, the coating was uncured and could be removed with acetone.

EXAMPLE 5

N-Trifluoromethanesulfonyloxyphthalimide was prepared by the following procedure. To a dried flask equipped with a stirrer, under nitrogen, were added N-hydroxyphthalimide (3.04 g, 18.7 mmol), 60 mL of dried DME, and trifluoromethanesulfonyl chloride (2.00 mL, 18.7 mmol). The mixture was cooled to −15° and triethylamine (3.00 mL, 22 mmol) was added dropwise by syringe. After warming to room temperature, 100 mL of methylene chloride was added and the resulting mixture was washed with 100 mL of 2% aqueous sodium bicarbonate and dried. Evaporation of the solvent gave 4.65 g of crude N-trifluoromethanesulfonyloxyphthalimide: mp 90°–93°. Recrystallization from methylene chloride-hexane gave 2.65 g (48%) of product as shiny white flakes: mp 99°–102°; uv (CH₃CN) 220 (47,000), 249 (2090), 297 nm (2290); ir (KBr) 1810 (m), 1750 (vs), 1440 (s), 1240 (s), 1230 (s), 1220 (s), 1115 (m), 940 (m), 860 (m), 695 (s), 585 (m); nmr (CDCl₃) 8.10–7.85 (m); ¹⁹F nmr (CDCl₃) −71.42 ppm (s); mass spectrum 294.9782 (calcd for C₉H₄NO₅F₃S: 294.9762).

Solutions were prepared of 50 mg of N-trifluoromethanesulfonyloxyphthalimide from above, 50 mg of a specified sensitizer, and 3.00 g of a 33 percent solution of ECN-1299 epoxy resin in DME. The solutions were spin-coated at 1000 rpm onto 10 cm × 10 cm anodized aluminum plates. The coated plates were exposed through a $\sqrt[3]{2}$ step wedge process transparency on a nu-Arc platemaker for a designated time. The platemaker employed, model FT26uPNS, contained a 2000 W xenon lamp positioned about 55 cm from the top of the instrument. Since radiation exposure was through a piece of plate glass, the active spectrum was approximately 310–450 nm. Exposure intensity was measured by an internal integrator. One unit of exposure corresponds to about 1 sec and is equal to about 5 mJ/cm²-sec. After exposure and a wait of 10 min, the plates were developed by washing with acetone. Results of a series of experiments using the aforesaid procedure are summarized in Table I.

TABLE 1

| Experiment | Sensitizer | Exposure (units) | Number of Polymer Steps |
|---|---|---|---|
| 1 | Anthracene | 30 | 6 |
| 2 | " | 60 | 10 |
| 3 | 9-Phenyl-anthracene | 10 | 3 |
| 4 | 9-Phenyl-anthracene | 20 | 7 |
| 5 | 9-Phenyl-anthracene | 30 | 10 |
| 6 | 9-Phenyl-anthracene | 60 | 12 |
| 7 | 9,10-Dimethyl-anthracene | 5 | 3 |
| 8 | 9,10-Dimethyl-anthracene | 10 | 7 |
| 9 | 9,10-Dimethyl-anthracene | 20 | 10 |
| 10 | 9,10-Dimethyl-anthracene | 60 | 15 |
| 11 | 9-Methyl-anthracene (1) | 20 | 9 |
| 12 | 9-Methyl-anthracene (1) | 30 | 11 |
| 13 | 9-Methyl-anthracene (1) | 60 | 14 |
| 14 | 1-Chloro-anthracene | 40 | 7 |
| 15 | 1-Chloro-anthracene | 50 | 8 |
| 16 | 1-Chloro-anthracene | 60 | 9 |
| 17 | 1,4-Dimethoxy-anthracene | 2 | 3 |
| 18 | 1,4-Dimethoxy-anthracene | 5 | 7 |
| 19 | 1,4-Dimethoxy-anthracene | 10 | 10 |
| 20 | 1,4-Dimethoxy-anthracene | 20 | 13 |
| 21 | Fluoroanthene | 20 | 1 |
| 22 | " | 40 | 5 |
| 23 | " | 60 | 7 |
| 24 | " | 80 | 9 |
| 25 | Rubrene | 60 | 15 |
| 26 | Pyrene | 30 | 5 |
| 27 | " | 40 | 7 |
| 28 | " | 50 | 7–8 |
| 29 | None | 150 | 7 |

(1) 150 mg of sensitizer was employed

EXAMPLE 6

N-Trifluoromethanesulfonyloxy-1,8-naphthalimide was prepared by the following procedure. To a dried flask equipped with a stirrer, under nitrogen, were added N-hydroxy-1,8-naphthalimide (3.00 g, 14.1 mmol), potassium tert-butoxide (1.60 g, 14.2 mmol), and 75 mL of THF. After stirring for 30 min, the solvent was evaporated, and the resulting red potassium salt was evacuated under vacuum pump pressure for 15 min. Addition of 75 mL of dried DME gave a purple color. The salt was cooled to −15° and trifluoromethanesulfonyl chloride (1.50 mL, 13.8 mmol) was added by syringe. After 15 min, the mixture was allowed to warm to room temperature. After 1 h, 100 mL of methylene chloride was added and the product was washed successively with 2% aqueous sodium bicarbonate and water. Evaporation of the resulting clear yellow solution gave 4.00 g of a yellow solid. Recrystallization from methylene chloride-hexane gave 2.51 g (51.6%) of pure N-trifluoromethanesulfonyloxy-1,8-naphthalimide: mp 217°–219°; uv (CH$_3$CN) 229 (45,300), 335 nm (8150); ir (KBr) 1730 (m), 1710 (s), 1575 (m), 1430 (s), 1235 (m), 1225 (s), 1210 (s), 1125 (m), 1000 (m), 765 (m); mass spectrum 344.9932 (calcd for C$_{13}$H$_6$NO$_5$F$_3$S: m+, 344.9928); $^{19}$F nmr (CDCl$_3$) −71.19 (s). Anal. Calcd for C$_{13}$H$_6$NO$_5$F$_3$S: C, 45.23; H, 1.75; N, 4.06; O, 22.17; S, 9.29; F, 16.51. Found: C, 45.12; H, 1.76; N, 4.36; F, 16.57.

Two solutions were prepared of 50 mg of N-trifluoromethanesulfonyloxy-1,8-naphthalimide and 3.00 g of a 33 percent solution of ECN-1299 epoxy resin in DME. To one was added 50 mg of 9-methylanthracene sensitizer. The solutions were spin-coated onto anodized aluminum plates at 1000 rpm. Plates were exposed for a specified time through a $^3\sqrt{2}$ step wedge process transparency on a nu-Arc platemaker. The exposed plates were developed by washing with acetone. Results of a series of experiments using the aforesaid procedure are summarized in Table II.

TABLE II

| Experiment | Sensitizer | Exposure (units) | Number of Polymer Steps |
|---|---|---|---|
| 1 | None | 30 | 1 |
| 2 | " | 40 | 3 |
| 3 | " | 60 | 6 |
| 4 | " | 80 | 9 |
| 5 | 9-Methyl-anthracene | 30 | 9 |
| 6 | 9-Methyl-anthracene | 40 | 11 |
| 7 | 9-Methyl-anthracene | 60 | 13 |
| 8 | 9-Methyl-anthracene | 80 | 15 |

EXAMPLE 7

N-Hydroxy-2,3-naphthalimide starting material was prepared by the following procedure.

To a stirred solution of hydroxylamine hydrochloride (5.7 g, 0.082 mol) in 125 mL of pyridine was added 2,3-naphthalic anhydride (14.85 g, 0.075 mol). A solid formed and went into solution on heating. The solution was held at 90°–100° for 30 min, the reaction mixture was cooled, and the pyridine was evaporated. The solid residue was mixed with 200 mL of water and 30 mL of concentrated hydrochloric acid. After stirring for 15 min, the precipitate was filtered, washed with water, then air and vacuum dried to give 14.93 g (93.5%) of off-white, solid, N-hydroxy-2,3-naphthalimide: mp 275°–282°; nmr (DMSO-d$_6$) 11.0 (1H, OH), 8.35 (s, 2H), 8.15 (m, 2H), 7.65 (m, 2H); ir (KBr) 3450 (b), 3150 (b), 1782 (m), 1710 (s), 1465 (m), 1142 (m), 1125 (m), 985 (m), 890 (m), 780 (m), 760 (m), 710 (m); mass spectrum 213.0427 (calcd for C$_{12}$H$_7$NO$_3$: 213.0425). Anal. Calcd for C$_{12}$H$_7$NO$_3$: C, 67.61; H, 3.31; N, 6.57; O, 22.51. Found: C, 67.84; H, 3.37; N, 6.38.

N-Trifluoromethanesulfonyloxy-2,3-naphthalimide was prepared by the following procedure. To a stirred mixture of N-hydroxy-2,3-naphthalimide (3.05 g, 14.3 mmol) from above and 125 mL of dried DME in a dried flask under nitrogen, which mixture was cooled to −15°, trifluoromethanesulfonyl chloride (1.50 mL, 13.8 mmol) followed by triethylamine (3.00 mL, 21 mmol) was added by syringe. The reaction mixture was warmed to room temperature, diluted with 200 mL of methylene chloride, washed successively with water, 2 percent aqueous sodium bicarbonate, and water, and dried. Evaporation of the solvent gave 4.78 g of a pale yellow solid; mp 148°–164°. The crude product was recrystallized from methylene chloride-hexane, dissolved in methylene chloride and passed through a 2 inch (5.1 cm) column of Florisil ®. Evaporation gave 3.00 g (61.6%) of a pale yellow solid, N-trifluoromethanesulfonyloxy-2,3-naphthalimide: mp 170°–173°; uv (CH$_3$CN) 217 (ε=30,600), 262 (63.400), 295 (6640), 347 (3510), and 363 nm (5260); nmr (CDCl$_3$) 840 (s, 2H), 8.10 (m, 2H), 7.70 (m, 2H)A$_2$B$_2$; $^{19}$F nmr (CDCl$_3$) −71.30 ppm (s); ir (KBr) 1795 (s), 1750 (vs), 1445 (s), 1238 (s), 1210 (s), 1170 (s), 1070 (m), 965 (m), 755 (s), 590 (s); mass spectrum 344.9888 (calcd for C$_{13}$H$_6$NO$_5$F$_3$S: 344.9918). Anal. Calcd for C$_{13}$H$_6$NO$_5$F$_3$S: C, 45.23; H, 1.75: N, 4.06; O, 23.17; S, 9.29; F, 16.51. Found: C, 45.31, 45.53; H, 1.90, 1.94; N, 3.96, 4.02; F, 16.51, 16.56.

A solution was prepared with 50 mg of N-trifluoromethanesulfonyloxy-2,3-naphthalimide from above, 50 mg of a specified sensitizer, and 3.00 g of 33 percent ECN-1299 epoxy resin in DME. A second solution, for unsensitized plates, was prepared with 200 mg of the substituted naphthalimide from above and 12.00 g of 33 percent epoxy resin in DME. The solutions were spin-coated at 1000 rpm onto anodized aluminum plates. The plates were exposed on the nu-Arc platemaker for a specified time through a $^3\sqrt{2}$ step wedge. The exposed plates were held for 10 min after exposure and then developed by washing with acetone. Results of a series of experiments using the aforesaid procedure are summarized in Table III.

TABLE III

| Experiment | Sensitizer | Exposure (units) | Number of Polymer Steps |
|---|---|---|---|
| 1 | None | 40 | 7 |
| 2 | " | 60 | 9 |
| 3 | 9-Methyl-anthracene | 20 | 9 |
| 4 | 9-Methyl-anthracene | 60 | 14 |
| 5 | 9,10-Dimethyl-anthracene | 5 | 7 |
| 6 | 9,10-Dimethyl-anthracene | 10 | 10 |
| 7 | 9,10-Dimethyl-anthracene | 20 | 12 |
| 8 | 9,10-Dimethyl-anthracene | 40 | 15 |
| 9 | 9,10-Dimethyl-anthracene | 60 | 17 |

EXAMPLE 8

3-Trifluoromethanesulfonyloxy-1,3-benzoxazine-2,4-dione was prepared by the following procedure. To a dried flask with a stirrer, under nitrogen, were added 3-hydroxy-1,3-benzoxazine-2,4-dione (3.35 g, 18.7 mmol) (U.S. Pat. 2,714,105) and 100 mL of dried DME. The mixture was held at −15°, and trifluoromethanesulfonyl chloride (2.00 mL, 18.7 mmol) followed by triethylamine (3.00 mL, 22 mmol) were added dropwise by syringe. After warming to room temperature, the reaction mixture was diluted with 200 mL of methylene chloride and washed successively with water, 2 percent aqueous sodium bicarbonate, and water, and then dried. Evaporation of the solvent gave 5.13 g of white solid: mp 73°–76°. Recrystallization from methylene chloride-hexane gave 3.60 g (62%) of 3-trifluoromethanesulfonyloxy-1,3-benzoxazine-2,4-dione: mp 74°–76°; uv (CH$_3$CN) 237 (11,100), and 289 nm (2180); ir (KBr) 1800 (s), 1742 (vs), 1612 (m), 1465 (s), 1448 (s), 1342 (m), 1228 (vs), 1126 (m), 1090 (m); mass spectrum 310.9686 (calcd for C$_9$H$_4$NO$_6$F$_3$S: 310.9701); 217,0098 (calcd for C$_9$H$_4$O$_3$F$_3$: 217.0112); 120.0200 (calcd for C$_7$H$_4$O$_2$: 120.0211). A second crop of product, 0.70 g, raised the overall yield to 73.9%.

A solution was prepared of 50 mg of 3-trifluoromethanesulfonyloxy-1,3-benzoxazine-2,4-dione, 50 mg of 9-methylanthracene sensitizer, and 3.00 g of a 33 percent solution of ECN-1299 epoxy resin in DME. The solution was spin-coated onto 10 cm × 10 cm anodized aluminum plates. The dried plates were exposed on a nu-Arc platemaker for a specified time through a $^3\sqrt{2}$ step wedge. The exposed plates were held for 10 min after exposure and then developed by washing with acetone. Results of a series of experiments using the aforesaid procedure are summarized in Table IV.

TABLE IV

| Experiment | Exposure (units) | Number of Polymer Steps |
|---|---|---|
| 1 | 10 | 3 |
| 2 | 15 | 6 |
| 3 | 20 | 7 |
| 4 | 30 | 9 |
| 5 | 40 | 11 |

EXAMPLE 9

N-Trifluoromethanesulfonyloxysuccinimide was prepared by the following procedure. To a dried flask equipped with a stirrer, under nitrogen, were added N-hydroxysuccinimide (2.10 g, 18.2 mmol), 60 mL of dried DME, and trifluoromethanesulfonyl chloride (2.00 mL, 18.7 mmol). The mixture was cooled in ice, and triethylamine (3 mL, 22 mmol) was added dropwise by syringe. After warming the reaction mixture to room temperature, 150 mL of methylene chloride was added and the organic layer was washed with water (3 × 100 mL) and dried. Evaporation of the solvent left 3.80 g of a white solid. Recrystallization from methylene chloride-hexane gave 3.22 g (71.6%) of N-trifluoromethanesulfonyloxysuccinimide: mp 122°–123°. A doubly recrystallized sample was prepared: mp 126°–127°; ir (KBr) 1695 (s), 1440 (s), 1230 (m), 1210 (m), 1140 (m), 1120 (m), 1030 (m), 790 (s), 590 (s); uv (CH$_3$CN) 234 nm (shoulder) ($\epsilon$=130); nmr (CDCl$_3$) 2.85 (s); $^{19}$F nmr −71.54 ppm (s); mass spectrum 246.9781 (calcd for C$_5$H$_4$NO$_5$F$_3$S: 246.9762). Anal. Calcd for C$_5$H$_4$NO$_5$F$_3$S: C, 24.30; H, 1.63; N, 5.67; O, 32.37; F, 23.06; S, 12.97. Found: C, 24.16; H, 1.57; N, 5.95.

Solutions were prepared of 50 mg of N-trifluoromethanesulfonyloxysuccinimide, 50 mg of a specified sensitizer, and 3.00 g of 33 percent ECN-1299 epoxy resin in DME. The solutions were spin-coated at 1000 rpm for 30 sec onto 10 cm × 10 cm anodized aluminum plates. The dried plates were exposed on a nu-Arc platemaker for a specified time through a $^3\sqrt{2}$ step wedge. The exposed plates were developed by washing with acetone. Results of a series of experiments using the aforesaid procedure are summarized in Table V.

TABLE V

| Experiment | Sensitizer | Exposure (units) | Number of Polymer Steps |
|---|---|---|---|
| 1 | 9-Methyl-anthracene | 20 | 3 |
| 2 | 9-Methyl-anthracene | 30 | 5 |
| 3 | 9-Methyl-anthracene | 40 | 8 |
| 4 | 9-Methyl-anthracene | 60 | 9 |
| 5 | 9-Methyl-anthracene | 80 | 10 |
| 6 | 1,4-Dimethoxy-anthracene | 5 | 3 |
| 7 | 1,4-Dimethoxy-anthracene | 10 | 7 |
| 8 | 1,4-Dimethoxy-anthracene | 20 | 9 |
| 9 | 1,4-Dimethoxy-anthracene | 30 | 12 |
| 10 | 1,4-Dimethoxy-anthracene | 40 | 13 |

EXAMPLE 10

A solution was prepared of 75 mg of N-trifluoromethanesulfonyloxyphthalimide, prepared as in Example 5, 75 mg of 9-methylanthracene sensitizer, and 4.50 g of 33 percent ECN-1299 epoxy resin in DME. The solution was spin-coated onto 10 cm × 10 cm anodized aluminum plates. The dried plates were exposed on a nu-Arc platemaker for a specified time through a $^3\sqrt{2}$ step wedge. The exposed plates were heated at a specified temperature and time, and development was completed by washing the exposed and heated plates with acetone. The results of a series of experiments using the aforesaid procedure, summarized in Table VI, show that heat treatment after exposure gives a significant increase in speed.

TABLE VI

| Experiment | Exposure (units) | Bake Temp. (°C.) | Bake Time (min) | Number of Polymer Steps |
|---|---|---|---|---|
| 1 | 1 | 100 | 1 | 1 |
| 2 | 1 | 100 | 5 | 5 |
| 3 | 1 | 100 | 10 | 8 |
| 4 | 1 | 100 | 15 | 10 |
| 5 | 5 | 100 | 1 | 7 |
| 6 | 5 | 100 | 5 | 10 |
| 7 | 5 | 100 | 10 | 12 |
| 8 | 5 | 100 | 15 | 14 |
| 9 | 1 | 120 | 1 | 3 |
| 10 | 1 | 120 | 2 | 6 |
| 11 | 5 | 120 | 1 | 8 |
| 12 | 5 | 120 | 2 | 11 |

EXAMPLE 11

Preparation of a Lithographic Film

A solution was prepared by mixing 3.00 g of 33 percent ECN-1299 epoxy resin in DME, 200 mg of a premilled 55/45, mixture of a methyl methacrylate:ethyl acrylate:acrylic acid (37:57:7) terpolymer (molecular weight 260,000 and acid number 76–85) and carbon black, 50 mg of 9-methylanthracene sensitizer, 50 mg of N-trifluoromethanesulfonyloxy-2,3-naphthalimide (prepared in Example 7), and 0.60 g of DME. The solution was coated on the resin-subbed side of an oriented polyethylene terephthalate film substrate using a 1-mil (25.4-μm) knife. The dried coating was approximately 8 μm in thickness. A portion of the coated film was exposed on a nu-Arc platemaker for 40 exposure units through a $3\sqrt[4]{2}$ step wedge. The exposed film was developed by dipping it into a solution of 2:1 methanol-acetone followed by washing with water. A clear black image of 9 polymer steps was obtained.

EXAMPLE 12

N-Tosyloxy-1,8-naphthalimide was prepared by the following procedure. To a stirred mixture of p-toluenesulfonyl chloride (3.82 g, 20 mmol), N-hydroxy-1,8-naphthalimide (4.26 g, 20 mmol) and 200 mL of dried THF was added dropwise a solution of triethylamine (3 mL, 22 mmol) in 25 mL of THF. After 3 h, 200 mL of methylene chloride was added and the reaction mixture was washed successively with water, 2.5 percent aqueous sodium bicarbonate (twice), and water. The organic layer was dried and the solvent was evaporated to leave 6.6 g of a tan solid: mp 238°–245°. The crude product was dissolved in chloroform, and the solution was passed through a 10 cm column of Florisil ®. Evaporation of the chloroform gave 6.30 g (85.8%) of off-white, solid, N-tosyloxy-1,8-naphthalimide: mp 240°–243°; uv ($CH_3CN$) 230 (61,500), 333 nm (13,900); ir (KBr) 1725 (m), 1700 (s), 1575 (m), 1370 (m), 1325 (m), 1225 (m), 1190 (m), 1180 (m), 1170 (m), 1005 (m), 890 (m), 880 (m), 770 (m), 695 (m), 685 (m); nmr ($CDCl_3$) 8.75–7.25 (m, 10H), 2.50 (s, 3H); mass spectrum 367.0538 (calcd for $C_{19}H_{13}NO_5S$: m+, 367.0512), 303.0890 (calcd for $C_{19}H_{13}NO_3$: m-$SO_2$, 303.0894).

N-2-Naphthalenesulfonyloxyphthalimide was prepared by the following procedure. To a flask equipped with a stirrer and addition funnel were added N-hydroxyphthalimide (8.15 g, 0.050 mol), 2-naphthalenesulfonyl chloride (11.4 g, 0.050 mol) and 125 mL of THF. A solution of triethylamine (8 mL, 0.058 mol) and 25 mL of THF was added dropwise. After 1 h stirring, the reaction mixture was diluted with 200 mL of methylene chloride and the organic layer was washed successively with water, 3 percent aqueous sodium bicarbonate, and water. The organic layer containing crystallized product was evaporated leaving 16.8 g of an off-white solid. Recrystallization from toluene gave 12.33 g (69.8%) of white, crystalline N-2-naphthalenesulfonyloxyphthalimide: mp 223°–225°; nmr ($CDCl_3$-DMSO-$d_6$) 8.8–7.7 (m), singlet at 7.9; uv ($CH_3CN$) 220 (67,000), 234 (79,800), 279 (6880), 317 (1825), 331 nm (1950); ir (nujol) 1787 (m), 1737 (s), 1380 (m), 1190 (s), 965 (s); mass spectrum 353.0350 (calcd for $C_{18}H_{11}NO_5S$: m+, 353.0357). Anal. Calcd for $C_{18}H_{11}NO_5S$: C, 61.19; H, 3.14; N, 3.96; O, 22.64; S, 9.07. Found: C, 61.03, 61.01; H, 3.13, 3.35; N, 4.06, 3.98.

A stock solution was prepared of 9.0 g of ECN-1299 epoxy resin and 60 ml of 1:1, by volume, acetonitrile-DME. Sixty mg of a specified photoinitiator was dissolved in 4 mL of the stock solution. The resultant solution was spin-coated at 1000 rpm onto 10 cm × 10 cm anodized aluminum plates. Each plate was exposed to a 275 W sunlamp at a distance of 17 cm for 20 min through a $3\sqrt[4]{2}$ step wedge, developed by washing with acetone, and then dyed in an ethyl acetate solution of Orasol ® Black CN (Ciba-Geigy) followed by a methanol wash. Results of a series of experiments using the aforesaid procedure are summarized in Table VII.

TABLE VII

| Experiment | Photoinitiator | Number of Polymer Steps |
|---|---|---|
| 1 | N—tosyloxy-1,8-naphthalimide (from above) | 11 |
| 2 | N—tosyloxytetrachlorophthalimide (as in Example 1) | 5 |
| 3 | N—2-naphthalenesulfonyloxyphthalimide (from above) | 6 |
| 4 | N—tosyloxyphthalimide (as in Example 4) | 5 |
| 5[(1)] | N—tosyloxyphthalimide (as in Example 4) | 11 |

[(1)]The photoinitiator-containing solution was saturated with anthracene before spin-coating.

BEST MODE FOR CARRYING OUT THE INVENTION

The best mode contemplated for carrying out the invention is described in Examples 5, 6, 7, 8, and 10.

INDUSTRIAL APPLICABILITY

The photopolymerizable compositions of the invention have wide applicability in the field of graphic arts. Such uses include lithographic printing, gravure images, preparation of printing plates for offset and letter press, engineering drafting films, photoresists in making printed circuits or in chemical milling, solder masks, flexographic printing, thermoset vesicular images, microimages for information storage, decoration of paper, glass, and metal packages, light cured coatings, and potting resins for electrical applications. Other specific uses will be evident to those skilled in the art.

While the preferred embodiments of the invention are described by the above, it is to be understood that the invention is not limited to the precise construction herein disclosed and that the right is reserved to all changes and modifications coming within the scope of the invention as defined in the following claims.

I claim:

1. The cationically photopolymerizable composition consisting essentially of
   (A) a cationically polymerizable organic composition; and
   (B) a photoinitiator which is a photosensitive sulfonic acid ester of a N-hydroxyamide or N-hydroxyimide, wherein the cationically polymerizable organic composition (A) is a monomeric or prepolymeric epoxide; the photoinitiator (B) is of the formula

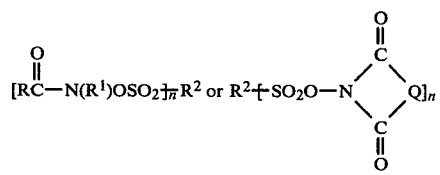

wherein $R^2$ is a monovalent or divalent organic group selected from aliphatic, cycloaliphatic, and aromatic groups; R is a monovalent organic group selected from aliphatic, cycloaliphatic, and aromatic groups; $R^1$ is H, a monovalent aliphatic or cycloaliphatic organic group or $$R-\overset{O}{\overset{\|}{C}}-;$$

Q is the divalent group which when combined with $$-N\diagup\overset{\overset{O}{\|}}{\underset{\underset{O}{\|}}{C-}}_{C-}$$

forms a 5–7 membered ring; and n is 1 or 2; and $$-N\diagup\overset{\overset{O}{\|}}{\underset{\underset{O}{\|}}{C-}}_{C-}$$

which contains, in addition to the essential components, (A) and (B), at least one nonessential additive which is a photosensitizing compound.

2. The composition of claim 1 wherein the photosensitizing compound is an aromatic or substituted aromatic hydrocarbon which is present in an amount which is about 1 to 20 percent by weight, based on the total combined weight of the photoinitiator, the cationically polymerizable organic composition and the nonessential additives.

3. The composition of claim 2 wherein $R^2$ is a $C_1$ to $C_{10}$ hydrocarbyl group or a substituted $C_1$ to $C_{10}$ hydrocarbyl group wherein the substituent is selected from F, Cl, Br, $NO_2$, CN, $\oplus N(CH_3)_3$, $C_6H_5$, $C_6F_5$ and $OCH_3$; Q, when combined with $$-N\diagup\overset{\overset{O}{\|}}{\underset{\underset{O}{\|}}{C-}}_{C-}$$

forms a 5–7 membered ring which contains only one nitrogen atom and no other hetero atoms; and n is 1; R is aryl; $R^1$ is H, $C_1$ to $C_4$ alkyl, or $$R-\overset{O}{\overset{\|}{C}}-.$$

4. The composition of claim 3 wherein $R^2$ is $CF_2CF_2H$.

5. The composition of claim 3 wherein $R^2$ is perfluoroalkyl.

6. The composition of claim 5 wherein $R^2$ is trifluoromethyl.

7. The composition of claim 1 wherein the composition contains in addition to (A) and (B), a polymeric binder.

8. The composition of claim 7 wherein the polymeric binder is present in an amount which is about 10 to 85%, by weight, based on the total combined weight of the photoinitiator, the cationically polymerizable organic composition and the nonessential additives.

9. The composition of claim 8 wherein the cationically polymerizable organic composition (A) is a melamine resin.

10. The cationically photopolymerizable composition consisting essentially of
(A) a cationically polymerizable organic composition selected from the group consisting of a monomeric or prepolymeric epoxide, a melamine resin and a mixture of the above; and
(B) a photoinitiator which is a photosensitive sulfonic acid ester of a N-hydroxyamide or N-hydroxyimide.

11. The composition of claim 10 wherein (A) is a monomeric or prepolymeric epoxide.

12. The composition of claim 10 wherein (A) is a melamine resin or a mixture thereof with a monomeric or prepolymeric epoxide.

13. The composition of claim 10 wherein the photoinitiator is present in an amount which is about 0.1 to about 10 percent, by weight, of the cationically polymerizable organic composition.

14. The composition of claim 10 which contains, in addition to the essential components, (A) and (B), at least one nonessential additive.

15. The composition of claim 11 wherein the epoxide is an epoxy novolak resin of molecular weight 1270 and epoxy equivalent weight of 235.

16. The composition of claim 12 wherein the melamine resin is a methylated/butylated (1/1) melamine resin.

17. The composition of claim 13 wherein the photoinitiator is present in an amount which is about 0.2 to about 5 percent, by weight, of the cationically polymerizable organic composition.

18. The composition of claim 14 wherein the composition contains in addition to (A) and (B), a polymeric binder.

19. The composition of claim 14 wherein the photoinitiator (B) is of the formula $$[R\overset{O}{\overset{\|}{C}}-N(R^1)OSO_2]_{\overline{n}}R^2 \text{ or } R^2\overline{(}SO_2O-N\diagup\overset{\overset{O}{\|}}{\underset{\underset{O}{\|}}{C-}}_{C-}\diagdown Q]_n$$

wherein $R^2$ is a monovalent or divalent organic group selected from aliphatic, cycloaliphatic, and aromatic groups; R is a monovalent organic group selected from aliphatic, cycloaliphatic, and aromatic groups; $R^1$ is H, a monovalent aliphatic or cycloaliphatic organic group or $$R-\overset{O}{\overset{\|}{C}}-;$$

Q is the divalent group which when combined with

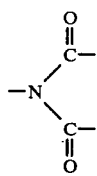

forms a 5-7 membered ring; and n is 1 or 2; and the non-essential additive is a photosensitive compound.

20. The composition of claim 18 wherein the polymeric binder is present in an amount which is about 10 to 85%, by weight, based on the total combined weight of the photoinitiator, the cationically polymerizable organic composition and the nonessential additives.

21. The composition of claim 19 wherein the photosensitizing compound is an aromatic or substituted aromatic hydrocarbon which is present in an amount which is about 1 to 20 percent by weight, based on the total combined weight of the photoinitiator, the cationically polymerizable organic composition and the nonessential additives.

22. The composition of claim 20 wherein the cationically polymerizable organic composition (A) is a melamine resin.

23. The composition of claim 21 wherein $R^2$ is a $C_1$ to $C_{10}$ hydrocarbyl group or a substituted $C_1$ to $C_{10}$ hydrocarbyl group wherein the substituent is selected from F, Cl, Br, $NO_2$, CN, $\oplus N(CH_3)_3$, $C_6H_5$, $C_6F_5$ and $OCH_3$; Q, when combined with

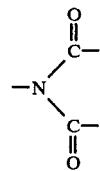

forms a 5-7 membered ring which contains only one nitrogen atom and no other hetero atoms; and n is 1; R is aryl; $R^1$ is H, $C_1$ to $C_4$ alkyl, or

24. The composition of claim 23 wherein $R^2$ is $CF_2CF_2H$.

25. The composition of claim 23 wherein $R^2$ is perfluoroalkyl.

26. The composition of claim 25 wherein $R^2$ is trifluoromethyl.

* * * * *